US008125616B2

(12) United States Patent  (10) Patent No.: US 8,125,616 B2
Vermeulen et al.  (45) Date of Patent: Feb. 28, 2012

(54) LITHOGRAPHIC APPARATUS WITH PRE-FORMED FLEXIBLE TRANSPORTATION LINE

(75) Inventors: Marcus Martinus Petrus Adrianus Vermeulen, Leende (NL); Henrikus Herman Marie Cox, Eindhoven (NL); Godfried Katharina Hubertus Franciscus Geelen, Echt (NL); Jérôme François Sylvain Virgile Van Loo, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 568 days.

(21) Appl. No.: 12/325,578

(22) Filed: Dec. 1, 2008

(65) Prior Publication Data
US 2009/0169661 A1 Jul. 2, 2009

Related U.S. Application Data

(60) Provisional application No. 60/996,673, filed on Nov. 29, 2007.

(51) Int. Cl.
*G03B 27/58* (2006.01)
*G03B 27/62* (2006.01)
(52) U.S. Cl. .......................... 355/72; 355/75
(58) Field of Classification Search .............. 355/72–76; 248/60
See application file for complete search history.

(56) References Cited

U.S. PATENT DOCUMENTS

| 6,583,597 | B2 * | 6/2003 | Tanaka et al. ........... 318/687 |
| 6,855,287 | B1 * | 2/2005 | Anzai ..................... 264/506 |
| 7,057,710 | B2 | 6/2006 | Korenaga |
| 7,236,228 | B2 | 6/2007 | Miyajima |

FOREIGN PATENT DOCUMENTS

| JP | 06-078335 A | 3/1994 |
| JP | 2001-028250 A | 1/2001 |
| JP | 2002-198284 A | 7/2002 |
| JP | 2004-273666 A | 9/2004 |
| JP | 2005-032817 A | 2/2005 |
| JP | 2005-046941 A | 2/2005 |

OTHER PUBLICATIONS

English-Language Translation of Notice of Reasons for Rejection directed to related Japanese Patent Application No. 2008-297416, mailed Jun. 2, 2011, from the Japanese Patent Office; 4 pages.

\* cited by examiner

*Primary Examiner* — Hung Henry Nguyen
*Assistant Examiner* — Michelle Iacoletti
(74) *Attorney, Agent, or Firm* — Sterne, Kessler, Goldstein & Fox P.L.L.C.

(57) ABSTRACT

A lithographic apparatus includes, in an embodiment, an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a flexible transportation line extending between a first and second part of the apparatus, the second part moveable with respect to the first part, wherein the line is pre-formed in a three-dimensional curve.

22 Claims, 5 Drawing Sheets

LITHOGRAPHIC APPARATUS WITH PRE-FORMED FLEXIBLE TRANSPORTATION LINE

CROSS-REFERENCE TO RELATED APPLICATIONS

The present application claims the benefit of U.S. Provisional Patent Application No. 60/996,673, filed Nov. 29, 2007, which is incorporated by reference herein in its entirety.

FIELD

Embodiments of the present invention relate to a lithographic apparatus with a pre-formed flexible transportation line and to an apparatus in general having such a pre-formed flexible transportation line.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a substrate table and/or patterning device support of current lithographic apparatus, a so-called short stroke part may be dynamically coupled to a so-called long stroke part thereof by hoses and wires to transport, for example, a cooling medium and electrical power. The stiffness and damping of the hoses and wires between the short stroke part and the long stroke part act as a parasite and may cause position errors. This may have a negative influence on the general performance of the apparatus. In particular, the parasitic stiffness and damping of the hoses and wires may be:
1. inhomogeneous for different directions (x,y,z);
2. variable in time due to changing material properties due to heating; and
3. relatively large in magnitude, causing relatively large errors.

Due to the first two reasons, feed forward compensation of disturbance forces due to the parasitic stiffness and damping may only be possible to a small extent (especially damping), leaving a large disturbance error. In addition, this error is direction dependent. By using two-dimensionally preformed hoses and wires with small diameter and applying highly elastic materials, this effect may be reduced. However, demands on the lithographic process are growing and further improvements are desired.

SUMMARY

It is possible to provide reduced parasitic stiffness and damping of dynamic couplings with transportation lines between moveable parts of an apparatus in general or of a lithographic apparatus specifically.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, in which a flexible transportation line is provided extending between a first and second part of the apparatus, the second part moveable with respect to the first part, wherein the line is pre-formed in a three-dimensional curve.

In another embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, in which a first and second flexible transportation line are provided extending between a first and second part of the apparatus, the second part moveable with respect to the first part, wherein the lines are each preformed in at least a two-dimensional curve, in which the pre-formed curves of the first and second lines have mirrored orientations with respect to each other.

According to a further embodiment of the invention, there is provided an apparatus including a flexible transportation line extending between a first and second part of the apparatus, the second part moveable with respect to the first part, wherein the line is pre-formed in a three-dimensional curve.

According to a still further embodiment of the invention, there is provided an apparatus including a first and second flexible transportation line extending between a first and second part of the apparatus, the second part moveable with respect to the first part, wherein the lines are each pre-formed in at least a two-dimensional curve, in which the pre-formed curves of the first and second lines have mirrored orientations with respect to each other.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate embodiments of the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
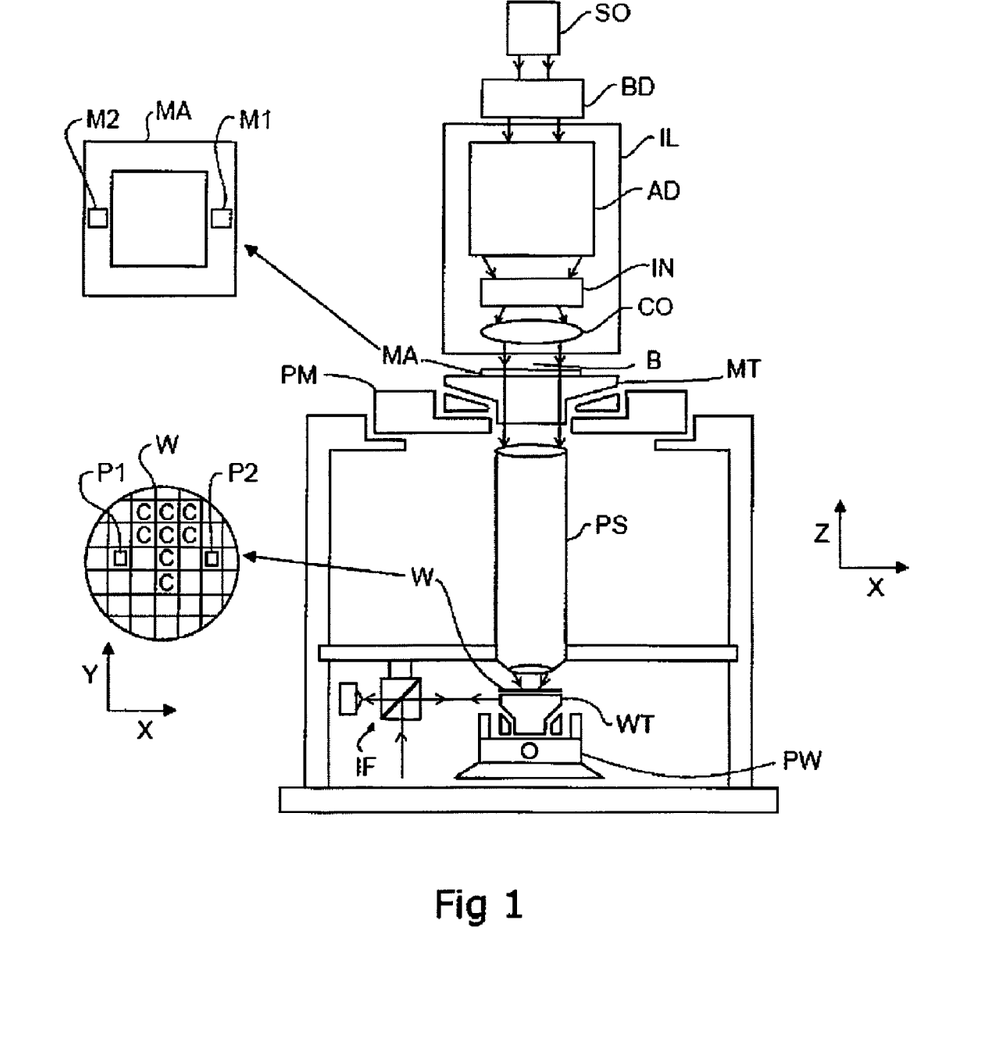
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The patterning device support or support structure supports the patterning device in a manner that depends on the orientation of the patterning device, the design of the lithographic apparatus, and other conditions, such as for example whether or not the patterning device is held in a vacuum environment. The patterning device support or support structure can use mechanical, vacuum, electrostatic or other clamping techniques to hold the patterning device. The patterning device support or support structure may be a frame or a table, for example, which may be fixed or movable as required. The patterning device support or support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask) MA, which is held on the patterning device support or support structure (e.g., mask table MT), and is patterned by the patterning device. Having traversed patterning device (e.g. mask) MA, radiation beam B passes through projection system PS, which focuses the beam onto a target portion C of substrate W. With the aid of second positioning device PW and position sensor IF (e.g. an interferometric device, linear encoder or capacitive sensor), substrate table WT can be moved accurately, e.g. so as to position different target portions C in the path of radiation beam B. Similarly, first positioning device PM and another position sensor (which is not explicitly depicted in FIG. 1) can be used to accurately position patterning device (e.g. mask) MA with respect to the path of radiation beam B, e.g. after mechanical retrieval from a mask library, or during a scan. In general, movement of patterning device support (e.g. mask table) MT may be realized with the aid of a long-stroke module (coarse positioning) and a short-stroke module (fine positioning), which form part of first positioning device PM. Similarly, movement of substrate table WT or "substrate support" may be realized using a long-stroke module and a short-stroke module, which form part of second positioner PW. In the case of a stepper (as opposed to a scanner), patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on patterning device (e.g. mask) MA, the mask alignment marks may be located between the dies.

The depicted apparatus could be used in at least one of the following modes:

1. In step mode, patterning device support (e.g. mask table) MT or "mask support" and substrate table WT or "substrate support" are kept essentially stationary, while an entire pattern imparted to the radiation beam is projected onto a target portion C at one time (i.e. a single static exposure). Substrate table WT or "substrate support" is then shifted in the X and/or Y direction so that a different target portion C can be exposed. In step mode, the maximum size of the exposure field limits the size of target portion C imaged in a single static exposure.

2. In scan mode, patterning device support (e.g. mask table) MT or "mask support" and substrate table WT or "substrate support" are scanned synchronously while a pattern imparted to the radiation beam is projected onto a target portion C (i.e. a single dynamic exposure). The velocity and direction of substrate table WT or "substrate support" relative to mask table MT or "mask support" may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, patterning device support (e.g. mask table) MT or "mask support" is kept essentially stationary holding a programmable patterning device, and substrate table WT or "substrate support" is moved or scanned while a pattern imparted to the radiation beam is projected onto a target portion C. In this mode, generally a pulsed radiation source is employed and the programmable patterning device is updated as required after each movement of substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
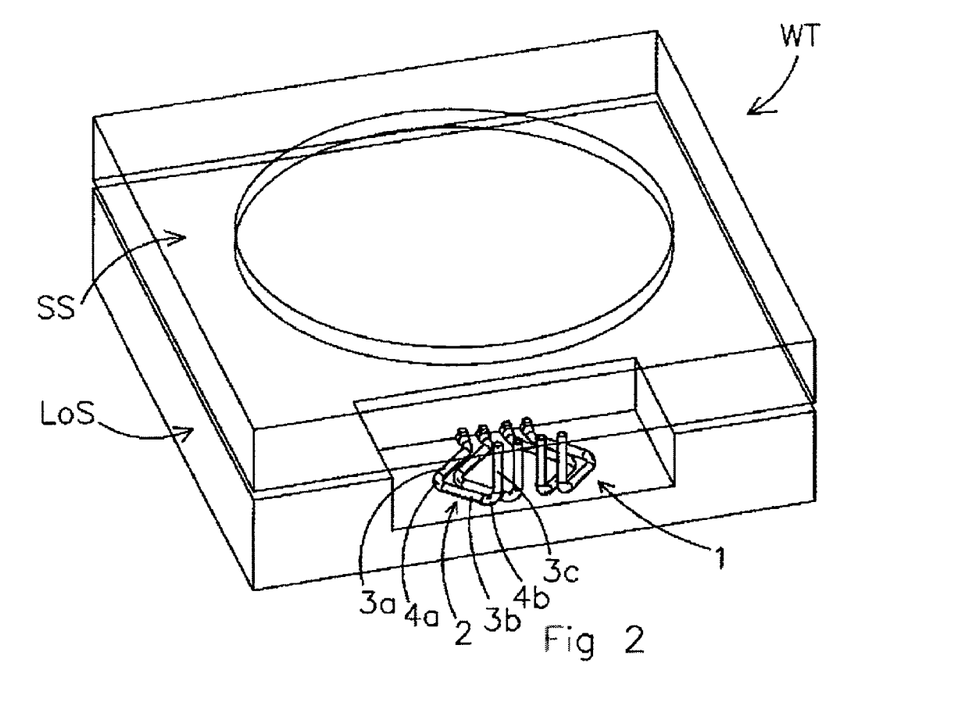
FIG. 2 shows an embodiment of a dynamic coupling with two sets of 3D-curved tubes with mirrored orientation between two modules of the apparatus in FIG. 1.

In FIG. 2, substrate table WT is shown as having a first lower part, here formed by a long stroke module LoS, and a second upper part, here formed by a short stroke module SS. The second upper part may be moveable with respect to the first lower part. In an embodiment, the two modules LoS and SS are moveable with respect to each other, and are moveably connected with each other using a dynamic chain of supplies 1 including several flexible transportation lines 2. Transportation lines 2 may be, for example, formed by hoses for transporting a medium, like a cooling liquid, and/or wires for transporting electricity between the two modules LoS and SS.

According to an aspect of the present invention transportation lines 2 are each pre-formed in a three-dimensional curve. With the definition "pre-formed in a three-dimensional curve," it is being meant that the supply line itself is pre-formed in such a way that it is to remain its specific shape if it is not loaded and/or substantially free of internal tensions, that is to say if it is substantially undistorted. In an embodiment, pre-formed transportation line 2 follows the contour of a three dimensional curve. In the embodiment of FIG. 2, two sets of transportation lines 2 are present which are positioned in such a way that they have mirrored orientations with respect to each other. Each individual line 2 includes a first, second and third leg 3a, 3b, 3c each extending in different directions and together covering the three dimensions. In the embodiment shown in FIG. 2, the legs 3a, 3b, 3c extend in directions orthogonal with respect to each other. Between the legs 3a, 3b, 3c, pre-formed bends 4a, 4b are present. Each bend 4a, 4b covers an angle of substantially 90 degrees.

By applying three-dimensionally pre-formed lines in pairs with mirrored orientation, a substantial reduction of disturbance forces (in magnitude and variation) between the two modules LoS and SS can be gained during movement of the modules with respect to each other. Lines 2 have appeared to have a reduced parasitic stiffness and damping mainly due to their individual three-dimensional pre-curved shape, and subsidiary because of their mirrored orientation in pairs. This large impact of these benefits becomes more clear when looking at FIGS. 3-6.

Figure 3:
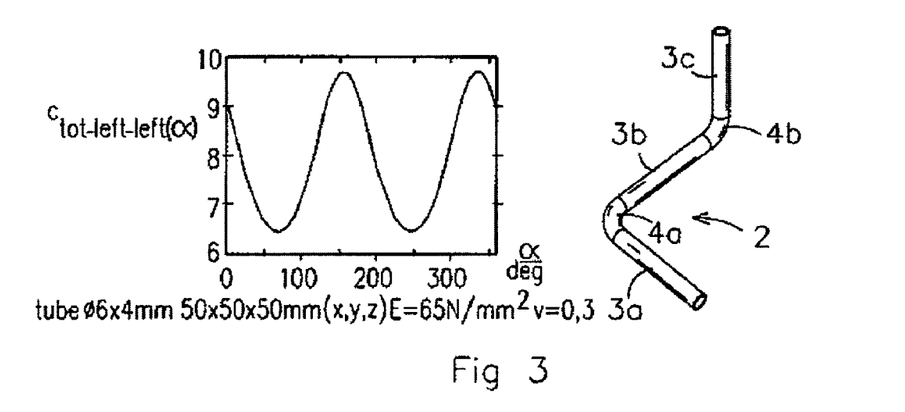
FIG. 3 shows the direction dependant stiffness of one of the 3D-curved tubes of FIG. 2.

The stiffness of an exemplary one of the three-dimensionally preformed lines 2 with equal length of its legs 3a, 3b, 3c as a function of the direction (from 0 to 360 deg) is given in FIG. 3. For damping a similar effect applies with different magnitude.

Figure 4:
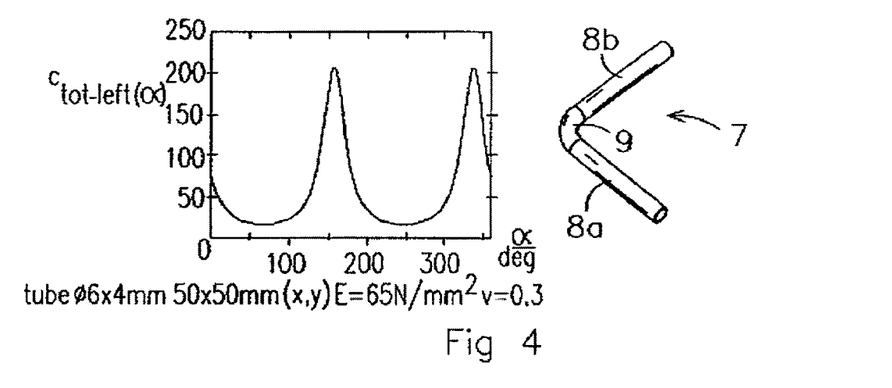
FIG. 4 shows the direction dependant stiffness of an exemplary 2D-curved tube.

FIG. 4 gives the stiffness for an exemplary two-dimensionally pre-formed line 7 with two orthogonal legs 8a, 8b connected with each other using a pre-formed bend 9. The legs and the bend have been given the same cross section and length as those of FIG. 3.

Comparison of FIGS. 3 and 4 shows that with three-dimensionally preformed line 2, the maximum value of the stiffness has decreased drastically to about 10 N/m, instead of 200 N/m for the two-dimensionally pre-formed line 7. Also the relative variation of FIG. 3 has reduced to about 35% instead of 90% for the two-dimensionally preformed line 7.

Figure 5:
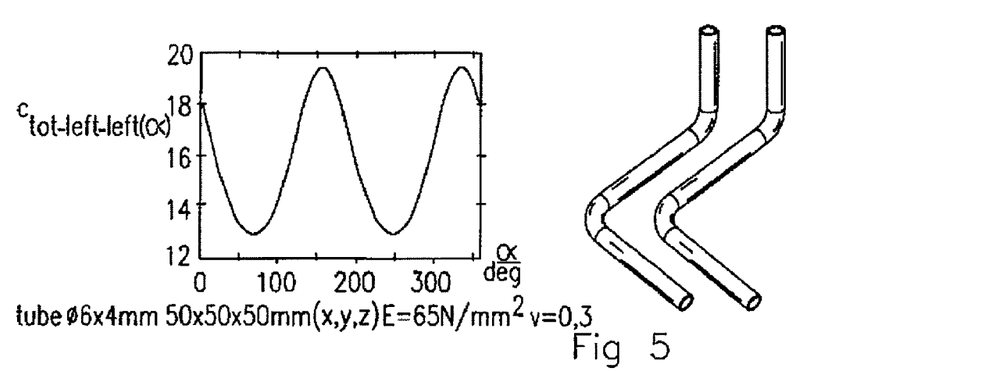
FIG. 5 shows the direction dependant stiffness of two of the 3D-curved tubes of FIG. 2 with similar orientation.
Figure 6:
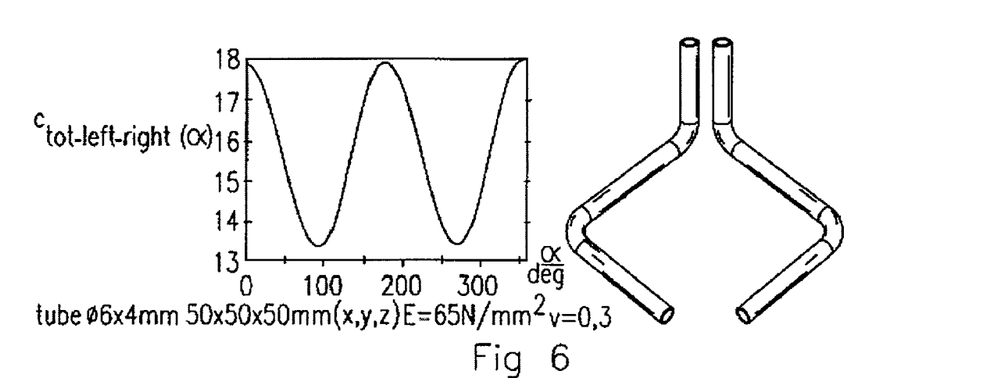
FIG. 6 shows the direction dependent stiffness of two of the 3D-curved tubes of FIG. 2 with mirrored orientation.

The benefit of the mirrored orientation in pairs becomes clear from comparing FIGS. 5 and 6. FIG. 5 shows a pair of lines 2 preformed in similar shapes and positioned parallel to each other. FIG. 6 shows a pair of lines 2 pre-formed in mirrored shapes and positioned opposite one another. Comparison of FIGS. 5 and 6 shows that with the mirrored orientation the maximum value of the stiffness is less than 18 N/m, instead of more than 19 N/m for the parallel orientation.

It is noted that such a mirrored orientation already offers large benefits for two-dimensionally pre-formed lines, like for example the line 7 as shown in FIG. 4. Another aspect of the present invention is therefore directed to the provision of at least two lines extending between two parts of an apparatus moveable with respect to each other and being each pre-formed in at least a two-dimensional curve, in which the pre-formed curves of the two lines have mirrored orientations with respect to each other.

Figure 7:
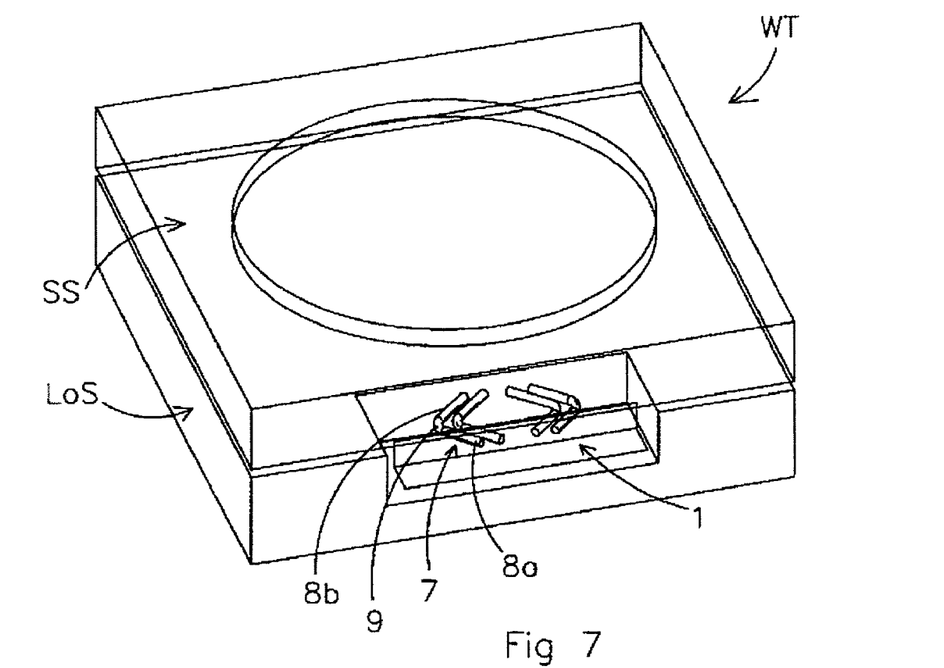
FIG. 7 shows a variant embodiment of FIG. 2 with two sets of 2D-curved tubes with mirrored orientation between the two modules of the apparatus in FIG. 1.
Figure 8:
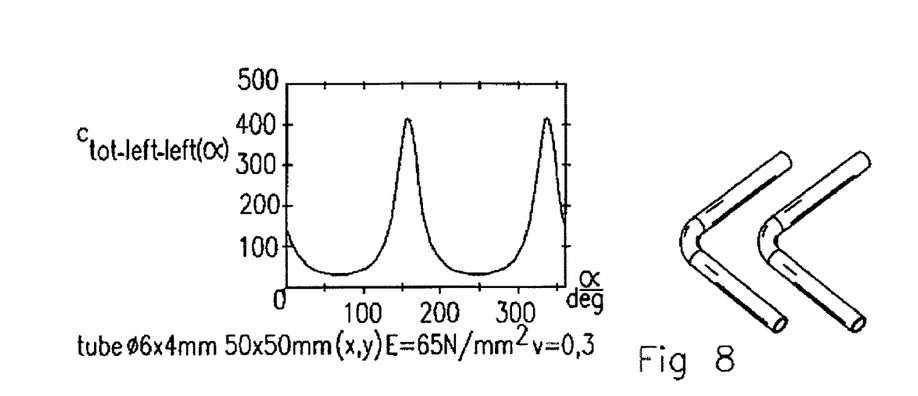
FIG. 8 shows the direction dependent stiffness of two of the 2D-curved tubes of FIG. 7 with similar orientation.
Figure 9:
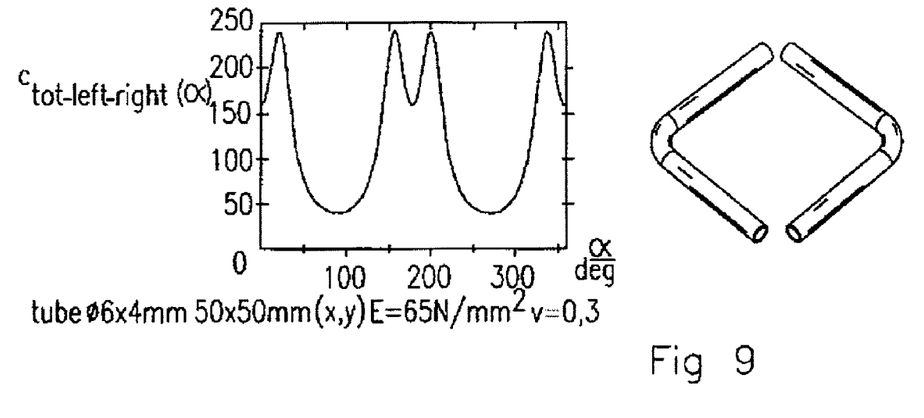
FIG. 9 shows the direction dependent stiffness of two of the 2D-curved tubes of FIG. 7 with mirrored orientation.

FIG. 7 shows a variant embodiment with two sets of the two-dimensionally pre-formed lines 7 of FIG. 4 with mirrored orientation between the two modules LoS and SS. FIG. 8 shows the direction dependent stiffness of two of the lines 7 with similar orientation, and FIG. 9 shows the direction dependent stiffness of two of the lines 7 with mirrored orientation. Comparison of FIGS. 8 and 9 shows that with the mirrored orientation, the maximum value of the stiffness has decreased drastically to about 250 N/m, instead of about 400 N/m for the parallel orientation (for certain leg length and cross section geometry). Also, the relative variation of FIG. 9 has reduced to about 80% instead of 90% in FIG. 8. Lines 7 can be built horizontally (in xy plane) or vertically (in xz or yz plane). The maximum stiffness of each of mirrored lines 7 do not coincide, resulting in a smaller total maximum stiffness and a smaller variation. As a result, both the magnitude and the uncorrectable variation of the disturbance forces from parasitic stiffness (and damping) are smaller.

Beside the embodiments shown many variants are possible. For example, the pre-formed lines may have other curved shapes as long as the pre-formed curved shapes are three-dimensional and/or have mirrored orientations when provided in pairs. For example, the pre-curved bend may also cover a somewhat larger or smaller angle. In particular the pre-curved bend may cover an angle of about +/−25 degrees with respect to the 90 degrees, leading to the angle lying between 65-115 degrees.

If the preformed line includes legs, then the lengths of these legs do not need to be the same, but may differ from one another. For example, to have both the benefit of small disturbances from parasitic stiffness and damping of three-dimensionally pre-formed lines, as well as small disturbances from vibrations, a three-dimensionally pre-formed line with reduced length of one (or more) legs can be applied. In particular at least one of the legs may then be given a length which is less than half the length of one of the other legs. In an embodiment, it is the upwardly rising leg which is then shortened. In practice, it has appeared that this might reduce the parasitic stiffness up to about 70% while the first natural frequency is less than about 20% reduced with respect to a three-dimensionally pre-formed line having equally long legs. Thus, depending on disturbance contributions from parasitic stiffness and damping on the one hand and that from vibrations on the other hand, the lengths of the legs can be adapted correspondingly.

The transportation lines according to an embodiment of the invention may also be applied between other parts of a lithographic apparatus, like for example between parts of the patterning device support or the projection system. The transportation lines according to an embodiment of the invention may also be applied between moveable parts of another type of apparatus, where disturbance forces from parasitic stiffness and damping from dynamic hoses and wires need to be minimized. The second part is moveable with respect to the first part. The first and the second part may both move. Alternatively, the first part may be stationary.

The line may be manufactured out of all kinds of materials as long as the materials are able to be pre-formed in a desired shape and at the same time are able to maintain a certain degree of flexibility. For example, the line may be a flexible hose having an E-modulus lying between about 0-200 N/mm2, such as about 65 N/mm2. Also, for example, the line may be a flexible wire for transporting electricity having an E-modulus lying between $0\text{-}150 \cdot 10^3$ N/mm2.

In an embodiment, the line includes a thermosetting plastic which has been given its pre-form in the desired three-dimensional curve in a mold under the influence of heat. With this, the line can be heated in the mold and after the line has cooled off, it is pre-formed and retains its three-dimensional shape as long as it remains undistorted.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate table constricted to hold a substrate;
a projection system configured to project the patterned radiation beam onto a target portion of the substrate; and
a first and a second flexible transportation line extending between a first and a second part of the apparatus, the second part moveable with respect to the first part,
wherein the first and second flexible transportation lines are each pre-formed in a three-dimensional curve and have substantially mirrored orientations with respect to each other.

2. A lithographic apparatus according to claim 1, wherein the first flexible transportation line comprises a first, a second and a third leg each extending in different directions in three dimensions, and pre-formed bends that are each provided between two adjacent legs, each pre-formed bend covering an angle in a range between about 65-115 degrees.

3. A lithographic apparatus according to claim 2, wherein the first, second and third legs extend in directions orthogonal with respect to each other, and each pre-formed bend covers an angle of about 90 degrees.

4. A lithographic apparatus according to claim 2, wherein at least one of the first, second and third legs has a length which is less than half the length of one of the other legs.

5. A lithographic apparatus according to claim 1, wherein the first and the second parts of the apparatus are parts of the substrate table, the patterning device support or the projection system.

6. A lithographic apparatus according to claim 1, wherein the first flexible transportation line is a hose configured to transport a medium or a wire configured to transport electricity between the first and the second part of the apparatus.

7. A lithographic apparatus according to claim 1, wherein the first flexible transportation line comprises a thermosetting plastic which has been pre-formed in the three-dimensional curve in a mold under the influence of heat.

8. A lithographic apparatus according to claim 1, wherein the first and the second part are movable.

9. A lithographic apparatus according to claim 1, wherein the first part is stationary.

10. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
a first and a second flexible transportation line extending between a first and a second part of the apparatus, the second part moveable with respect to the first part,
wherein the first and the second flexible transportation line are each pre-formed in at least a two-dimensional curve, and wherein the pre-formed first and second flexible transportation lines have substantially mirrored orientations with respect to each other.

11. A lithographic apparatus according to claim 10, wherein the first and the second part of the apparatus are parts of the substrate table, the patterning device support or the projection system.

12. A lithographic apparatus according to claim 10, wherein each of the first and second flexible transportation lines is a hose configured to transport a medium or a wire configured to transport electricity between the first and the second part of the apparatus.

13. A lithographic apparatus according to claim 10, wherein the first and the second part are movable.

14. A lithographic apparatus according to claim 10, wherein the first part is stationary.

15. An apparatus comprising:
a first and a second flexible transportation line extending between a first and second part of the apparatus, the second part moveable with respect to the first part,
wherein the first and second flexible transportation lines are pre-formed in a three-dimensional curve and have substantially mirrored orientations with respect to each other, and wherein the first and the second parts of the apparatus are parts of a substrate table, a patterning device support or a projection system of a lithographic apparatus.

16. An apparatus according to claim 15, wherein the first flexible transportation line is a hose configured to transport a medium or a wire configured to transport electricity between the first and the second part of the apparatus.

17. An apparatus according to claim 15, wherein the first and the second parts are movable.

18. An apparatus according to claim 15, wherein the second part is stationary.

19. An apparatus comprising:
a first and a second flexible transportation line extending between a first and a second part of the apparatus, the second part moveable with respect to the first part,
wherein the first and the second flexible transportation lines are each pre-formed in at least a two-dimensional curve, and wherein the pre-formed first and second flexible transportation lines have substantially mirrored orientations with respect to each each other, and wherein the first and the second parts of the apparatus are parts of a substrate table, a patterning device support or a projection system of a lithographic apparatus.

20. An apparatus according to claim 19, wherein each of the first and second flexible transportation lines is a hose configured to transport a medium or a wire configured to transport electricity between the first and the second part of the apparatus.

21. An apparatus according to claim 19, wherein the first and the second parts are movable.

22. An apparatus according to claim 19, wherein the first part is stationary.

* * * * *